(12) United States Patent
Yarza

(10) Patent No.: US 7,209,360 B1
(45) Date of Patent: Apr. 24, 2007

(54) LEAK-TIGHT SYSTEM FOR BOXES CONTAINING ELECTRICAL AND ELECTRONIC COMPONENTS

(75) Inventor: Jorge Gimenez Yarza, Valls (ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 11/163,759

(22) Filed: Oct. 28, 2005

(51) Int. Cl.
*H05K 7/02* (2006.01)
*H05K 7/14* (2006.01)
*H01L 23/28* (2006.01)

(52) U.S. Cl. ...................... 361/752; 361/730; 361/736; 174/521; 174/520; 257/787

(58) Field of Classification Search ........ 361/719–721, 361/752, 730, 736; 174/52.2, 521, 50.52–50.54, 174/520; 257/678, 787; 439/76.1, 76.2
See application file for complete search history.

(56) References Cited

U.S. PATENT DOCUMENTS

| | | | | |
|---|---|---|---|---|
| 5,295,044 | A * | 3/1994 | Araki et al. ................ | 361/709 |
| 5,327,325 | A * | 7/1994 | Nicewarner, Jr. ........... | 361/760 |
| 5,586,388 | A * | 12/1996 | Hirao et al. .................. | 29/830 |
| 5,689,089 | A * | 11/1997 | Polak et al. ................ | 174/536 |
| 5,706,180 | A * | 1/1998 | Lacroix et al. ............. | 361/800 |
| 6,180,045 | B1 * | 1/2001 | Brandenburg et al. ...... | 264/263 |
| 6,303,860 | B1 * | 10/2001 | Van Rens et al. .......... | 174/521 |
| 6,307,749 | B1 * | 10/2001 | Daanen et al. .............. | 361/704 |
| 6,355,881 | B1 * | 3/2002 | Braeges et al. ............. | 174/521 |
| 6,380,487 | B1 * | 4/2002 | Hollenbeck et al. ........ | 174/135 |
| 6,384,332 | B1 * | 5/2002 | Skrzypchak ................ | 174/522 |
| 6,407,925 | B1 * | 6/2002 | Kobayashi et al. ......... | 361/752 |
| 6,583,355 | B2 * | 6/2003 | Skrzypchak ................ | 174/521 |
| 6,665,192 | B2 * | 12/2003 | Wimberger Friedl et al. .......................... | 361/752 |
| 6,707,678 | B2 * | 3/2004 | Kobayashi et al. ......... | 361/752 |
| 7,026,548 | B2 * | 4/2006 | Bolken et al. .............. | 174/538 |
| 2002/0029900 | A1 * | 3/2002 | Wimberger Friedl et al. .......................... | 174/258 |

* cited by examiner

*Primary Examiner*—Dean A. Reichard
*Assistant Examiner*—Dameon E. Levi
(74) *Attorney, Agent, or Firm*—Bruce E Harang

(57) ABSTRACT

The system consists of fixing the printed circuit board (3) to the bottom (1) of the body of the box with the cooperation of a perimetral and spacing flap (6) which creates a chamber (7) under the board (3), in which the components (4) associated to the lower side of said board are housed, subsequently filling the outer perimetral space of said flap (6) with a resin mass (8), which is applied in liquid state and solidifies immediately afterwards, such that said resin (8) perfectly seals the chamber (7), while at the same time provides a thick protective layer on the upper side of the printed circuit board (3), also protecting the latter, which allows for the cover (2) of the box to have openings for ventilation of certain components (4') which generate a remarkable amount of heat.

7 Claims, 3 Drawing Sheets

LEAK-TIGHT SYSTEM FOR BOXES CONTAINING ELECTRICAL AND ELECTRONIC COMPONENTS

OBJECT OF THE INVENTION

The present invention refers to a system which has been specially designed to achieve a perfect protection of the electrical and electronic components located inside a distribution box or the like against the effects of ambient moisture.

The object of the invention is to prevent moisture from decreasing the dielectric strength between the tracks and components of the printed circuit board or boards bearing them, to in turn prevent effects of electromigration which usually generate unwanted signals and other failures.

The invention is of particular application in the automotive field, particularly in that of electrical systems for automobiles.

BACKGROUND OF THE INVENTION

There is currently a widespread use of electronic modules, power distribution boxes and/or electronics and power boxes, having a high number of electrical and electronic components, assembled on one or more printed circuit boards, which modules, due to their own nature and especially due to their practical application, in many cases exposed to the elements, require a high protection index against ambient moisture.

To achieve this effect of protection against moisture, such electronic modules, power distribution boxes and/or electronics and power boxes are housed inside boxes provided with means of fixing the printed circuit board or boards, boxes for which leak-tightness is achieved by means of arranging rubber gaskets between the body and the cover thereof.

On the other hand, there is also a generalized tendency to reduce the dimensions of such electronic modules, and accordingly of the box containing them, which in many cases implies the necessity of bringing the electroconductive tracks of the printed circuit board or boards excessively close to one another, which favors electromigration due to the effect of moisture.

Furthermore, many of such electronic modules generate a substantial amount of heat, which must be dissipated, occasionally with the cooperation of radiators duly associated to certain components. The housing of these elements inside the box makes the heat dissipation very difficult considering that to prevent the problem of the moisture, it is necessary for the closure of the box to be leak-tight, as previously stated, such that the temperature inside them can reach levels implying a risk of deterioration for said components.

The problem of electromigration is solved by means of applying an insulating varnish to the printed circuit board or boards, but the protection index against it is insufficient in many cases and, furthermore, does not solve the problem of heat dissipation.

DESCRIPTION OF THE INVENTION

The system proposed by the invention solves in a fully satisfactory manner the drawbacks set forth above in the different aspects discussed.

To that end, more specifically and according to one of the features of the invention, rather than achieving the leak-tightness by means of an also leak-tight coupling between the body and the cover of the box, said leak-tightness is obtained by providing the printed circuit board with a perimetral support flap distancing it from the bottom of the box, such that defined between the printed circuit board, flap and bottom of the box is a chamber in which the components associated to the printed circuit board on its lower side are housed.

This chamber is thereby definitively made leak-tight, and said components are consequently protected against the effects of moisture, by means of pouring on the printed circuit board a suitable amount of resin in liquid state, which solidifies immediately afterwards, which on one hand acts as a sealing element for said chamber as it covers the perimetral space defined between the also perimetral flap and the side walls of the box, and which on the other hand defines a protective layer of considerable thickness on the upper side of the printed circuit board, in turn protecting both the electroconductive tracks existing therein and the terminals of the different electrical and electronic components associated to it. The use of rubber gaskets and the problems derived therefrom, mainly due to the assembly of said gaskets in their housings, are thus prevented.

According to another one of the features of the invention, the cover of the box will be partially open, since, according to the invention, said cover loses its function as a leak-tight closure element, such that the openings of said cover will be duly opposite to the heat-generating components, whereby these function "in the open air" and optimal heat dissipation is ensured.

The system is obviously applicable to boxes on the bottom of which several independent printed circuit boards are arranged, and even in those other boxes in which the printed circuit boards adopt different levels or different orientations, by means of the incorporation of partition walls in the latter case which act as containment means for the resin in those areas of the box in which the level thereof must be higher.

Given that said openings of the cover for ventilation of the heat-dissipating components allow water to access the interior thereof, it has been provided for that these openings be prolonged into inner collars, extending up to the level of the resin layer surrounding said components, whereby each heat-dissipating component is housed in a recess, the box having a drainage groove in its periphery facilitating the draining of water towards the exterior of the box.

According to that set forth above, the system proposed by the invention prevents the use of rubber gaskets and sealing, completely eliminates problems caused by water and moisture, being especially suitable in devices with a high protection index, allows the protection of printed circuit boards located at different levels, also allows the elements or components to function in the open air, with optimum dissipation of the heat generated by them, and furthermore prevents breakages in the components due to thermal expansion and shrinking occurring in processes such as overmolding or encapsulating.

DESCRIPTION OF THE DRAWINGS

To complement the description being made and for the purpose of helping to better understand the features of the invention, according to a preferred practical embodiment example thereof, a set of drawings is attached as an integral part of said description in which the following has been shown with an illustrative and non-limiting character.

PREFERRED EMBODIMENT OF THE INVENTION

In the indicated figures, the body of the box containing the electronic module is indicated with reference number (1), the complementary cover with (2), the printed circuit board with (3) and the components associated thereto, both on its lower and upper side, with (4).

Figure 3:
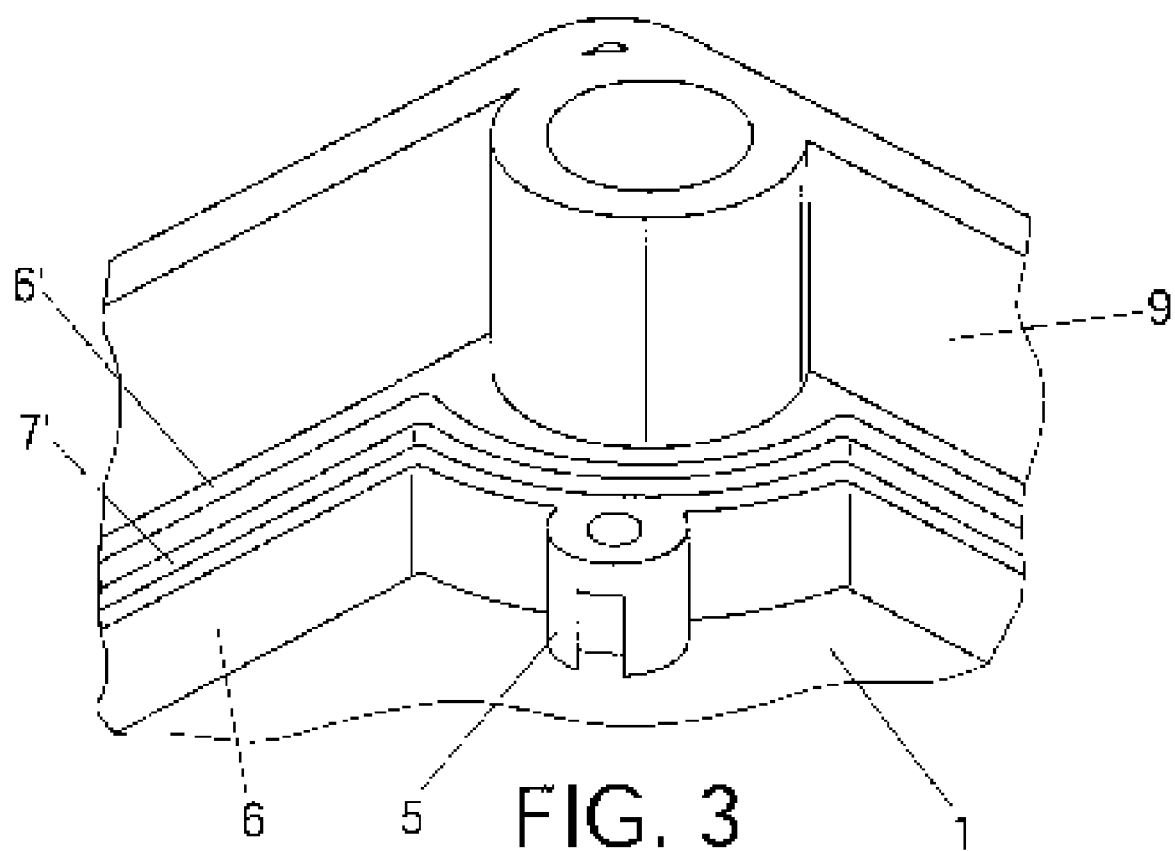
FIG. 3 shows an enlarged perspective view of a detail of one of the corners of the box in which a possible fixing means and part of the perimetral rib and its inner channel can be observed.

According to the invention, the printed circuit board (3) is located inside the body (1) of the box, suitably spaced from its bottom so that the lower components (4) can be placed, said board (3) being fixed to the body (1) by means of screws which can be coupled in threaded collars (5), especially visible in the detail of FIG. 3. Said collars do not have to be threaded since self-threaded screws or other fixing means, such as rivets, adhesive, clips, etc., can be used alternatively. Said printed circuit board (3) rests on a perimetral flap or rib (6), which may project therefrom but which will preferably project from the bottom of the body (1) and which defines, in any case, in addition to the suitable spacing between said bottom (1) and the printed circuit board (3), a chamber (7) housing all the lower components (4) of the board (3), a chamber which is definitively made leak-tight by means of a resin mass (8) which, in addition to filling the perimetral space defined between the flap or ribs (6) and the side wall (9) of the body (1) of the box, provides a thick layer on the upper side of the printed circuit board (3), covering both the electroconductive tracks thereof and the terminals of the components (4) assembled on its upper side.

As previously stated, this resin mass (8) is applied in liquid state, the solidification thereof occurring immediately afterwards, whereby the printed circuit board (3) is perfectly protected on both sides against the effects of moisture.

A second perimetral rib (6') has been provided immediately inside the perimetral flap or rib (6), such that a channel (7') is provided between both ribs which also perimetrically surrounds the chamber (7), such that a possible overflow of the resin (8) above the rib (6) is collected in said channel (7'), making it impossible for said resin to reach the lower components (4) of the printed circuit board (3).

Figure 1:
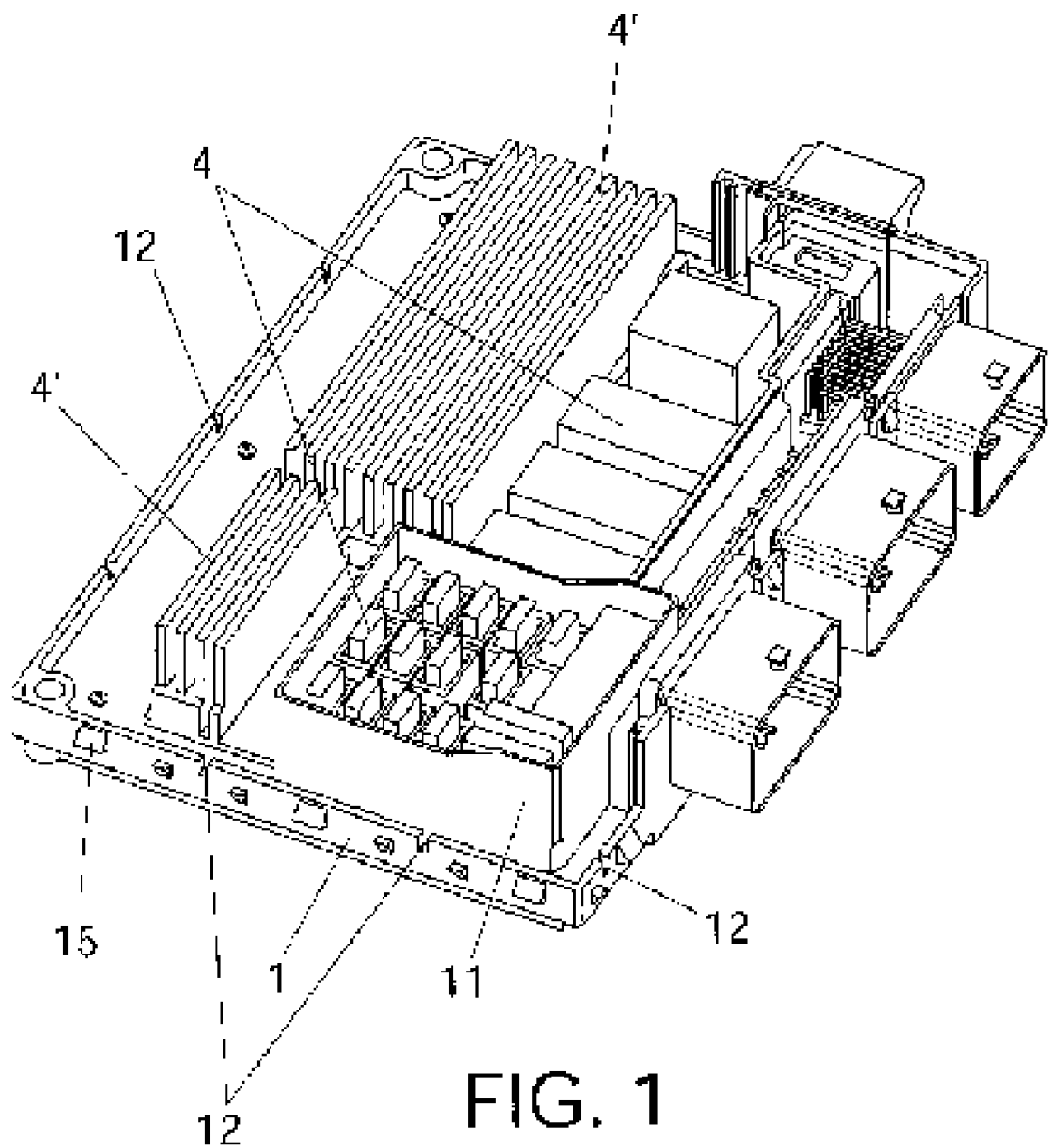
FIG. 1 shows a perspective view of an electronic module assembled on a containing box, not provided with its cover, but provided with the leak-tight system constituting the object of the present invention.
Figure 2:
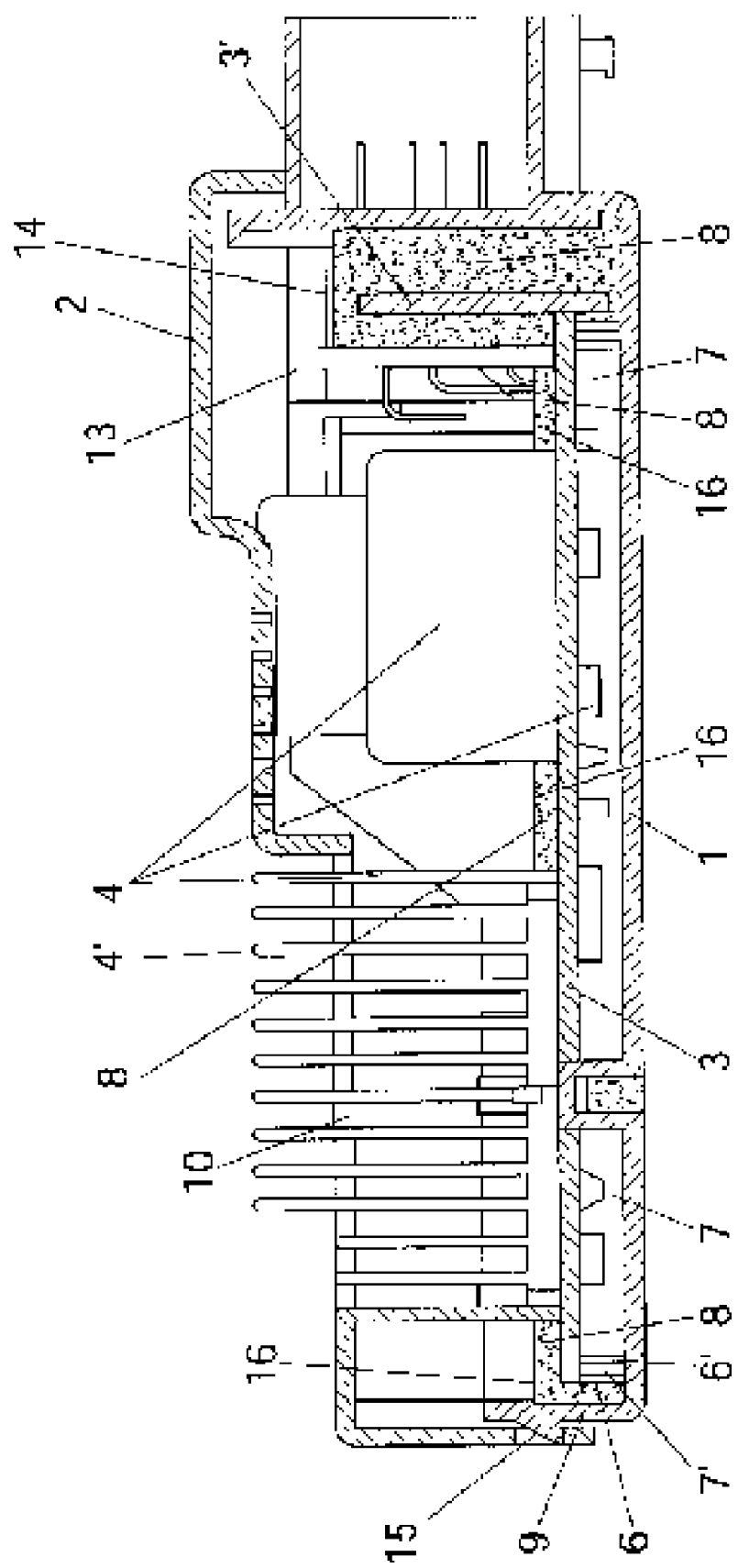
FIG. 2 shows a profile and sectional view of a detail of the block of the previous Figure, with its cover duly assembled.

In those electronic modules in which there are components (4) generating a significant amount of heat, which must be dissipated, such as, for example, the components (4') incorporating a heat dissipation radiator, the cover (2) of the box will incorporate windows (10) duly opposite to said components (4'), which components can even partially project to the exterior of the box, as shown in FIG. 2, whereby achieving maintaining optimal heat dissipation conditions of the module.

To drain the water which may enter in the box, drainage grooves 12 are arranged, preferably on the sides thereof, facilitating the draining of the water towards the exterior of the box.

In certain electronic modules, such as the one represented in the Figures, there can also be printed circuit boards (3') in vertical arrangement, for example in one of the outlying areas of the box, in which case the cooperation of partition walls (13) has been provided for, which extend from the main printed circuit board (3) up to a level higher than that of the second board (3'), and which define a side compartment housing said second board (3'), in which the latter is completely immersed in the resin (8), which reaches a level (14) also situated above the upper edge of said board (3'), as is perfectly observed in FIG. 2.

It is also possible to arrange a chamber (11) housing other components, said chamber (11) being able to be independent or be included in the body of the box (2). Said chamber (11) is sealed at its lower portion due to the overall level of resin (16), and at the upper portion its design can contemplate a geometry allowing access to other components requiring accessibility, such as fuses for example. It is appropriate that this chamber be protected by a conventional and removable protection element, such as a cover with a rubber gasket, for example.

In all other respects, the body (1) and the cover (2) of the box will be fixed, for example, by means of a conventional tongue and groove pressure coupling (15), requiring no leak-tight means inasmuch as the latter is defined exclusively by the resin mass (8).

What is claimed is:

1. A leak-fight system for boxes containing electrical and electronic components comprising in cooperative combination:
    a) a box body (1) having a bottom and sidewalls (9), said sidewalls having perimetral flap (6);
    b) a complementary cover (2);
    c) a printed circuit board (3) having an upper and a lower surface with electrical and electronic components (4) mounted upon both said upper and said lower surfaces, dimensioned to mount within said box (1) on said perimetral flap (6) defining a chamber (7) housing said electronic components (4) mounted on said printed circuit board (3) lower surface; and
    d) a resin mass (8) poured in liquid state onto said circuit board (3) upper surface filling the space defined by said printed circuit board (3) upper surface, said perimetral flap (6) and said sidewalls (9) and solidifying thereon, thereby forming a humidity protective layer over said printed circuit board upper surface and sealing said chamber (7); and
    said leak tight system further characterized as having a second printed circuit board (3') arranged in a vertical position inside the box (1) in a side receptacle defined by a partition wall (13) having a height exceeding the upper edge of said second printed circuit board (3'), suitable to be covered by resin (8).

2. A leak-tight system for boxes containing electrical and electronic components according to claim 1, characterized in that said printed circuit board (3) is fixed to said body (1) of the box by means of screws situated outside of said perimetral flap (6), in the receiving area of the resin mass (8), having inside said perimetral flap (6) a second flap (6') defining a channel (7') surrounding said chamber (7) in which said lower components (4) of said printed circuit board are housed, said channel (7') acting as a resin (8) overflow catching device.

3. A leak-tight system for boxes containing electrical and electronic components according to one of claims 1 or 2, characterized in that said cover (2) incorporates windows (10) operatively opposite heat-dissipating components (4'), such that said heat-dissipating components (4") are in the open air, partially projecting to the exterior through said windows.

4. A leak-tight system for boxes containing electrical and electronic components according to one of claims 1 or 2, characterized in that said box (1) has drainage grooves (12) on its perimeter.

5. A leak-tight system for boxes containing electrical and electronic components according to one of claims 1 or 2, characterized in that said box (1) has a chamber (11) housing components requiring accessibility having an upper portion and a lower portion, said chamber (11) being sealed at its lower portion by said resin (16) and having a geometry allowing for access to said components in its upper portion.

6. A leak-tight system for boxes containing electrical and electronic components according to claim 5, characterized in that said chamber (11) is independent from the body of the box (1).

7. A leak-tight system for boxes containing electrical and electronic components according to claim 5, characterized in that said chamber (11) is within said box (1) body.

* * * * *